(12) United States Patent
Jung et al.

(10) Patent No.: US 6,342,730 B1
(45) Date of Patent: Jan. 29, 2002

(54) LOW-PIN-COUNT CHIP PACKAGE AND MANUFACTURING METHOD THEREOF

(75) Inventors: Kyujin Jung, Kyunggi-do; Kun-A Kang, Seoul; Hyung Jun Park, Kyunggi-do, all of (KR)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/492,820

(22) Filed: Jan. 28, 2000

(51) Int. Cl.[7] .......................... H01L 23/48; H01L 29/40
(52) U.S. Cl. ....................... 257/692; 257/787; 257/693; 257/734
(58) Field of Search ................................ 257/692, 787, 257/693, 734, 739, 784, 678; 438/112, 124, 127

(56) References Cited

U.S. PATENT DOCUMENTS

| | | | |
|---|---|---|---|
| 5,900,676 A | * | 5/1999 | Kweon et al. ............... 257/787 |
| 6,187,614 B1 | * | 2/2001 | Takata et al. ............... 438/112 |
| 6,198,171 B1 | * | 3/2001 | Huang et al. ............... 257/787 |
| 6,201,292 B1 | * | 3/2001 | Yagi et al. ................... 257/692 |
| 6,208,023 B1 | * | 3/2001 | Nakayama et al. ......... 257/692 |

OTHER PUBLICATIONS

R.O.C. Publication No. 348306, dated Nov. 7, 1985, entitled Device Having Resin Package and Method of Producing the Same (English Abstract).

* cited by examiner

Primary Examiner—Jhihan B Clark

(57) ABSTRACT

A low-pin-count chip package including a die pad for receiving a semiconductor chip and a plurality of connection pads electrically coupled to the semiconductor chip. The semiconductor chip, the die pad, and the connection pads are encapsulated in a package body such that the lower surfaces of the die pad and the connection pads are exposed through the package body. The present invention is characterized in that the die pad and the connection pads have a substantially concave profile thereby prolonging the time for moisture diffusion into the package as well as enhancing the "locking" of the die pad and the connection pads in the package body. The present invention further provides a method of producing the low-pin-count chip package described above.

8 Claims, 6 Drawing Sheets

LOW-PIN-COUNT CHIP PACKAGE AND MANUFACTURING METHOD THEREOF

BACKGROUND OF THE INVENTION

1. Field of the Invention

This invention relates to semiconductor chip packages, and more specifically to low-pin-count chip packages and manufacturing methods thereof.

2. Description of the Related Art

FIG. 1 is a low-pin-count chip package 100 according to a preferred embodiment disclosed in R. O. C. Publication No. 348306 entitled "Device Having Resin Package And Method Of Producing The Same" The low-pin-count chip package 100 includes a chip 110 sealed in a package body 120. The active surface of the chip 110 is provided with a plurality of bonding pads 110a electrically connected to a plurality of connection pads 130. The backside surface of the chip 110 is exposed from the package body 120 through a conductive adhesive layer 112. The connection pads 130 are located at the periphery of the chip 110 and exposed from the lower surface of the package body 120 for making external electrical connection. Since the package body 120 does not cover the exposed lower surface of the connection pads 130, it can not firmly lock the connection pads 130.

The connection pads 130 are usually made of metal with good electrical conductivity such as copper but the package body 120 is made of insulating material such as epoxy molding compound. Accordingly, the bond between connection pads 130 and the package body 120 is relatively weak and the difference of the coefficient of thermal expansion (CTE) therebetween is very large. Because of the CTE mismatch, stresses are induced at the interface between the connection pads and the plastic package body as the conventional package experiences temperature cycling. The stresses, in turn, result in the delamination at the metal-plastic interface. When the delaminations had occurred at the plastic-metal interface, moistures from the environment are easy to penetrate into the plastic package body and accumulate in the delaminated area. Once moisture accumulates in the package, rapid temperature ramp-up will cause the moisture to vaporize and expand, thereby inducing an hygrothermal stresses in the delaminated area which causes the surrounding plastic package body to popcorn. One of the most common occurrence of package popcorning occurs when the package described above is surface-mounted to a printed wiring board during the InfraRed reflowing process.

Further, since the package body 120 only seals one side of the chip 110, moisture and/or ionic contamination from the atmosphere can sometimes penetrate through the bonding lines between the epoxy molding compound and the chip 110, which can cause reliability problems, i.e. a great reduction of the operating life of package. This phenomenon is becoming more and more critical as the semiconductor industry moves towards packaging electronic devices into a smaller and smaller packages.

SUMMARY OF THE INVENTION

The present invention therefore seeks to provide a low-pin-count chip package which overcomes, or at least reduces the above-mentioned problems of the prior art.

Accordingly, in a first aspect, the present invention provides a low-pin-count chip package including a die pad for receiving a semiconductor chip and a plurality of connection pads electrically coupled to the semiconductor chip. A package body is formed over the semiconductor chip and the connection pads in a manner that the lower surfaces of the die pad and the connection pads are exposed through the package body. The present invention is characterized in that the die pad and the connection pads have a substantially concave profile thereby enhancing the "locking" of the die pad and the connection pads in the package body as well as prolonging the path and time for moisture diffusion into the package According to a second aspect, this invention further provides a method of producing a low-pin-count chip package. The method comprises the steps of: (A) providing a sheet carrier; (B) laminating a metal layer on the sheet carrier; (C) half-etching the metal layer so as to form concavities at predetermined regions thereof; (D) forming a photoresist layer on the metal layer; (E) half-removing the photoresist layer such that only photoresist within the concavities is left; (F) forming a metal coating on the surface of the metal layer which is not covered by the photoresist; (G) stripping the remaining photoresist within the concavities; (H) etching the metal layer so as to form a die pad and a plurality of connection pads having a substantially concave profile; (I) attaching a semiconductor chip onto the die pad; (J) electrically coupling the semiconductor chip to the connection pads; (K) forming a package body over the semiconductor chip and the connection pads wherein the substantially concave profile helps the package body to lock the connection pads in the package body; (L) removing the sheet carrier; and (M) forming a protective metal flash on the lower surfaces of pad and the connection pads.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
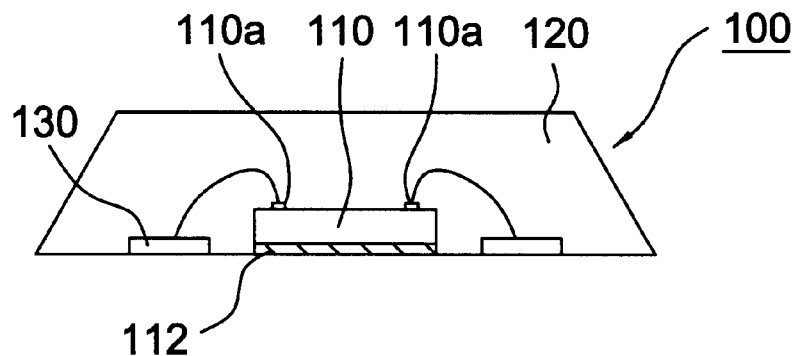
FIG. 1 is a cross-sectional view of a low-pin-count chip package according to a preferred embodiment disclosed in R. O. C. Publication No. 348306 entitled "Device Having Resin Package And Method Of Producing The Same"
Figure 2:
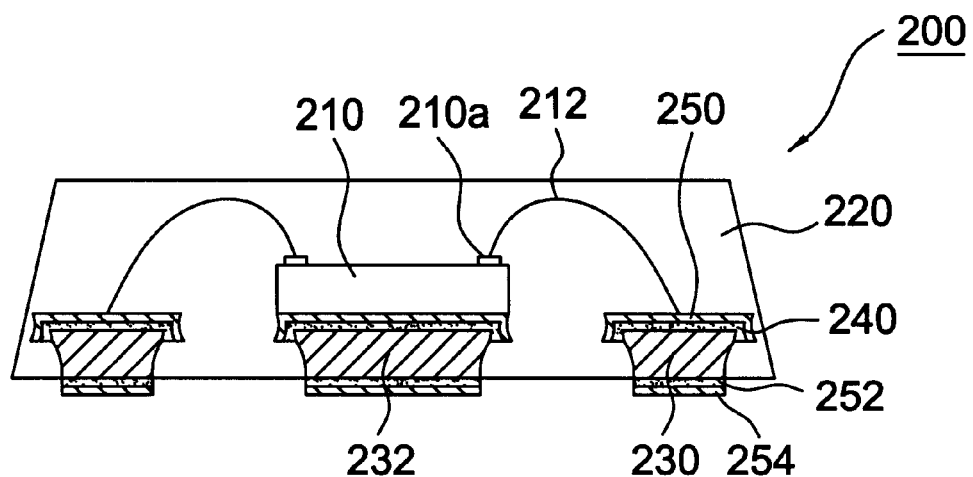
FIG. 2 is a cross-sectional view of a low-pin-count chip package according to a first embodiment of the present invention.

FIG. 2 discloses a low-pin-count chip package 200 in accordance with a first embodiment of the present invention comprising a chip 210 attached to a die pad 232 by either a conductive adhesive layer or nonconductive adhesive layer, e.g., epoxy (not shown). The active surface of the chip 210 is provided with a plurality of bonding pads 210a electrically connected to connection pads 230 through bonding wires 212. The connection pads 230 are arranged at the periphery of the die pad 232. The connection pads 230 and the die pad 232 are exposed from the bottom of the package body 220 and both of them have a substantially tapering profile for enhancing the "locking" of the die pad 230 and the connection pads 232 into predetermined place in the package body 220 as well as prolonging the path and time for moisture diffusion into the package 200. A package body 220 is formed over the semiconductor chip 210 and the connection pads 230.

Preferably, the die pad 232 and the connection pads 230 are provided with a metal coating which allows a good bond to be formed with the bonding wires 212. The metal coating typically comprises a layer of nickel 240 substantially covering the upper surfaces of the die pad 232 and the connection pads 230 as well as a portion of the side surface of the die pad 232 and the connection pads 230 adjacent thereto, and a layer of gold (or palladium) 250 covering the nickel layer 240. The lower surfaces of the die pad 232 and the connection pads 230 have a protective metal flash formed thereon. Preferably, the protective metal flash comprises a layer of nickel 252 covering the lower surfaces of the die pad 232 and the connection pads 230, and a layer of gold (or palladium) 254 covering the nickel layer. The protective metal flash prevents the die pad 232 and the connection pads 230 from corrosion or contamination.

The chip package 200 can be mounted onto a substrate, such as a printed circuit board (PC board), like other leadless devices. For example, a PC board is screen printed with a solder paste in a pattern which corresponds to the pattern of the connection pads 230 exposed from the bottom surface of the package 200. The package 200 is then appropriately positioned on the PC board and the solder is reflowed by using the conventional surface mount technology. Alternatively, the connection pads 230 exposed from the bottom surface of the package 200 can be printed with solder paste and then mounted onto a substrate.

FIGS. 3–10 show a method of making the low-pin-count chip package 200 according to a first embodiment of the present invention.

Figure 3:
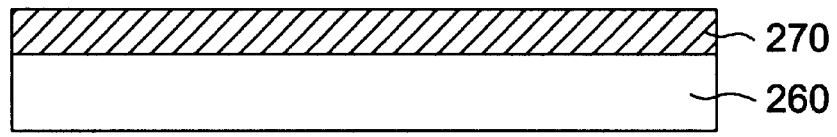
FIGS. 3–10 illustrate a method of making a low-pin-count chip package according to a first embodiment of the present invention.

FIG. 3 illustrates a sheet carrier 260 and a metal layer 270 such as a copper foil laminated thereon. Specifically, the sheet carrier 260 is preferably a polyimide or polyester tape with a layer of silicone adhesive (not shown) formed thereon. The metal layer 270 is laminated on the sheet carrier 260 by conventional methods such as thermocompression. The purpose of the sheet carrier 260 is used to support the semiconductor chip 210 during the assembly process for producing the low-pin-count chip package 200.

Figure 4:
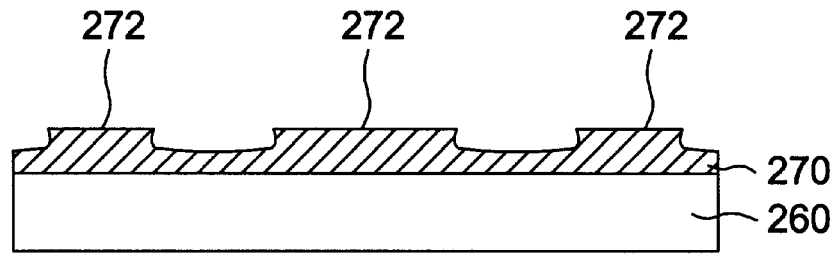

Referring to FIG. 4, the metal layer 270 is half-etched to form concavities at predetermined region thereof. Projections 272 not etched in the half-etching process will form the die pad 232 and the connection pads 230 afterward. In this embodiment, the thickness of the metal layer 270 is approximately 5~20 mil, and the etching depth of each of the concavities formed by the half-etching process is about 2–8 mil which depends on the thickness of the metal layer 270. It is noted that the "half-etching" herein does not mean only exactly removing an half of the thickness of the metal layer 270 through etching but also includes a partial etching for removing merely a part of the thickness of the metal layer 270.

Figure 5:
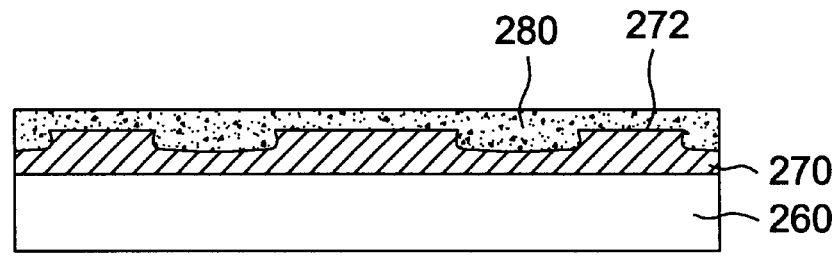

Referring to FIG. 5, a photoresist layer 280 is formed on the metal layer 270 by conventional techniques such as printing. The photoresist layer 280 is mainly composed of a resin mixture, and a photoactive material that makes the photoresist layer 280 photodefinable.

Figure 6:
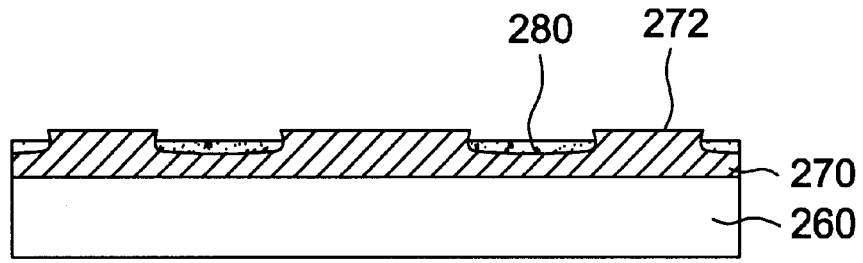

Referring to FIG. 6, the photoresist layer 280 is half-removed by conventional techniques such that only photo-resist within the concavities is left. It is noted that the photoresist layer 280 is preferably half-removed such that all projections 272 slightly protrude from the remaining photoresist whereby all projections 272 are substantially exposed from the remaining photoresist, and the surface of each concavity is almost entirely covered by the remaining photoresist.

It is understood that the photoresist layer 280 could be half-removed such that all projections 272 are substantially at the same level with the remaining photoresist.

Figure 7:
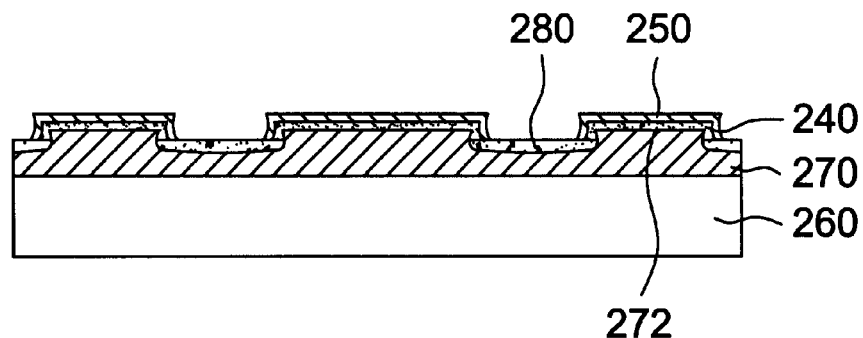

Referring to FIG. 7, the metal coating including a layer of nickel 240 and a layer of gold (or palladium) 250 are formed on the exposed projections 272 by using conventional plating techniques. Firstly, the nickel layer 240 is plated on the exposed projections 272 and then the gold (or palladium) layer 250 is plated on the nickel layer 240. If the photoresist layer 280 of FIG. 6 had been half-removed such that all projections 272 were substantially at the same level with the remaining photoresist, the metal coating would be formed on the top surface of the exposed projections 272. Preferably, the photoresist layer 280 is preferably half-removed such that all projections 272 slightly protrude from the remaining photoresist whereby the metal coating is formed not only on the top surface of the exposed projections 272 but also on the side surface adjacent thereto.

Figure 8:
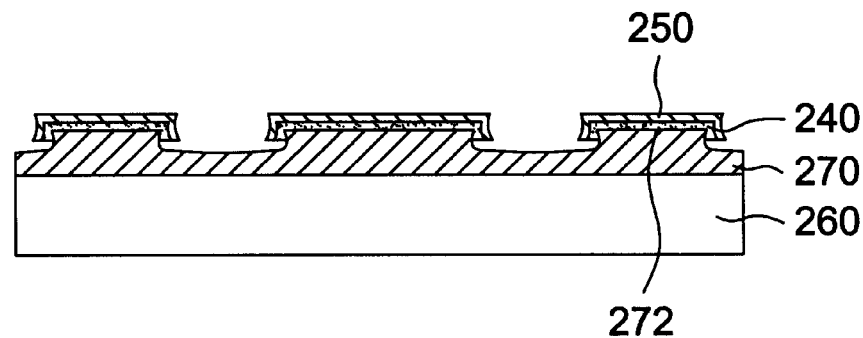

Referring to FIG. 8, the photoresist layer 280 is stripped by conventional methods.

Figure 9:
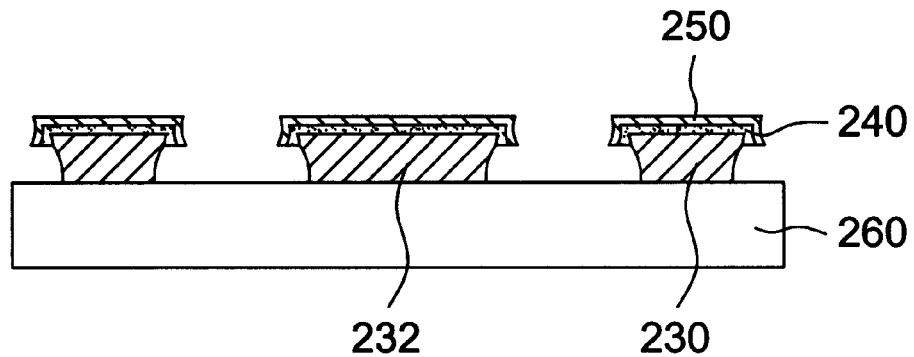

Referring to FIG. 9, the die pad 232 and the connection pads 230 are formed by etching the concavities of the metal layer 270 without the protection of the metal coating (see FIG. 8). Therefore, through precisely adjusting parameters of the etching process, e.g., the concentration of etchant or the time period of the etching process, the die pad 232 and the connection pads 230 have a substantially concave profile when etching process is completed. Moreover the metal coating on a portion of the side surface of the die pad 232 and the connection pads 230 can help to reduce "undercut" occurred in isotropic etching. Since the metal coating is also formed on the connection pads 230 for electrical connecting to the chip 210, the metal coating should be formed of materials that allow a good bond to the conventional bonding wire.

Figure 10:
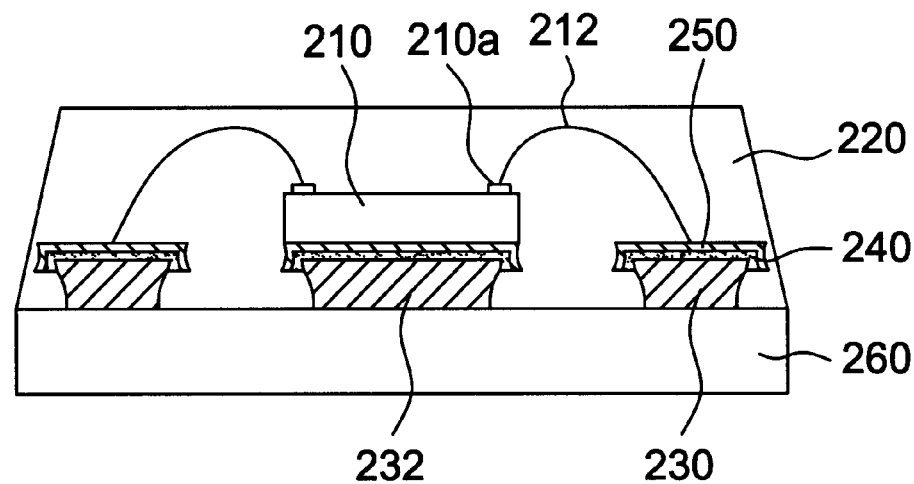

Referring to FIG. 10, the backside surface of the semiconductor chip 210 is securely attached onto the die pad 232 through an adhesive layer such as conductive/nonconductive epoxy (not shown). The bonding wires 212 are connected to the bonding pads 210a on the chip 210 and the connection pads 230 using known wire bonding techniques. Then, the package body 220 is formed over the sheet carrier 260, the connection pads 230 and the semiconductor chip 210 using known plastic molding methods such as transfer molding. During the curing process, the molding compound shrinks and imposes mechanical stresses on the die pad 232 and connection pads 230. Thus, the die pad 232 and the connection pads 230 are locked in position by the hardened molding compound.

Finally, a separation process is proceeded to remove the sheet carrier 260 and then a protective metal flash is plated on the lower surfaces of the die pad 232 and the connection pads 230 thereby the low-pin-count chip package 200 is obtained as shown in FIG. 2. Specifically, the separation process is accomplished by peeling off the sheet carrier 260 directly. After peeling, the die pad 232 and the connection pads 230 are still embedded in the package body 220.

Preferably, the protective metal flash comprises a layer of nickel 252 covering the exposed portions of the die pad 232 and the connection pads 230 through the package body 220, and a layer of gold (or palladium) 254 covering the nickel layer 252. The protective metal flash can help to prevent the exposed portions of the die pad 232 and the connection pads 230 from corrosion thereby assuring the heat dissipating as well as the solder-joint reliability of the die pad 232 and connection pads 230.

Figure 11:
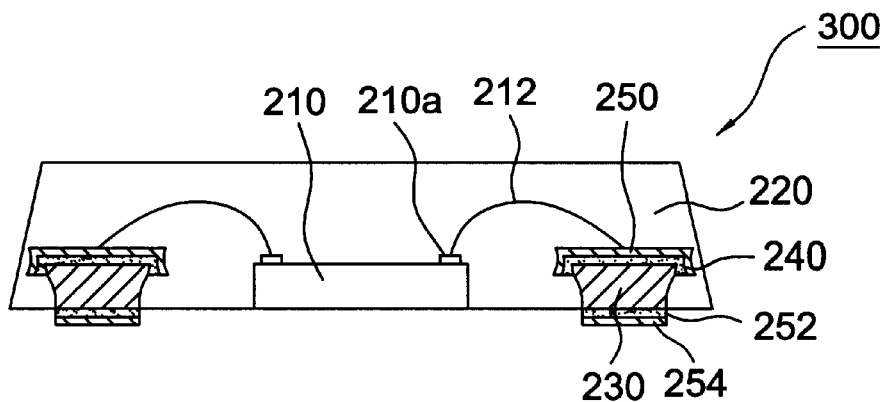
FIG. 11 is a cross-sectional view of a low-pin-count chip package according to a second embodiment of the present invention.

FIG. 11 discloses a low-pin-count chip package 300 in accordance with a second embodiment of the present invention comprising a chip 210 sealed in a package body 220. The chip package 300 is substantially identical to the chip package 200 of FIG. 2 with exception that the die pad 232 is skipped and the adhesive layer (not shown) is directly exposed from the package body 220.

FIGS. 12–15 illustrate a method of making the low-pin-count chip package 300 according to a second embodiment of the present invention.

Figure 12:
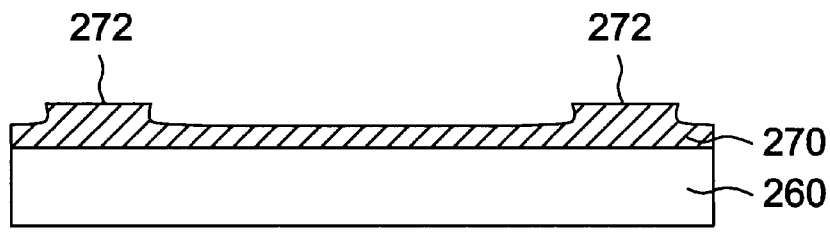
FIGS. 12–15 illustrate a method of making a low-pin-count chip package according to a second embodiment of the present invention.

Referring to FIG. 12, a metal layer 270 is laminated on a sheet carrier 260 and the metal layer 270 is half-etched to form concavities at predetermined positions thereof. Projections 272 not etched in the half-etching process will form the connection pads 230 afterward.

Figure 13:
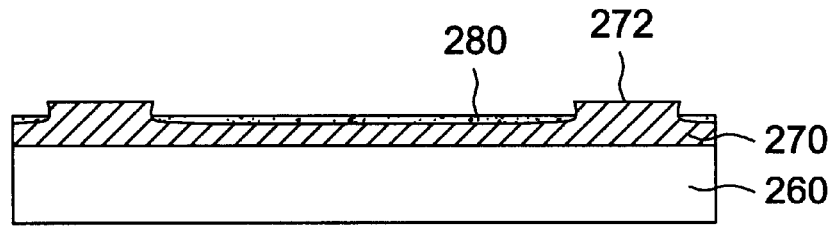

Referring to FIG. 13, a photoresist layer 280 is formed on the metal layer 270 and half-removed such that only photoresist within the concavities is left. It is noted that projections 272 are substantially exposed from the remaining photoresist, and the surface of each concavity is almost entirely covered by the remaining photoresist.

Figure 14:
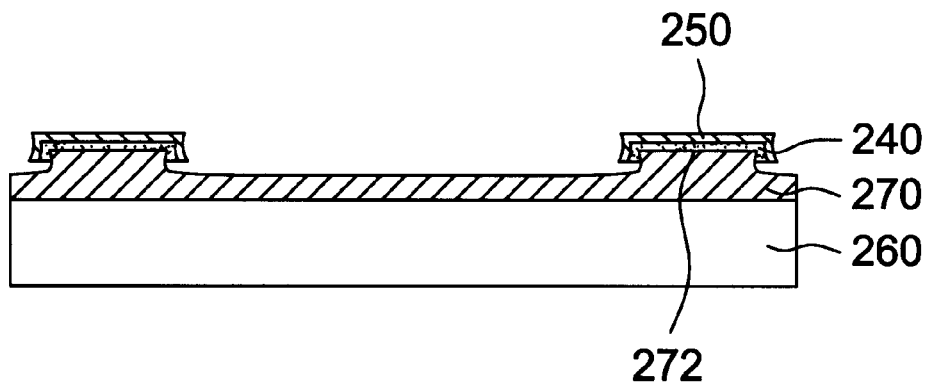

Referring to FIG. 14, the metal coating including a layer of nickel 240 and a layer of gold (or palladium) 250 are formed on the exposed projections 272 (referring to FIG. 13), and then the photoresist layer 280 is stripped.

Figure 15:
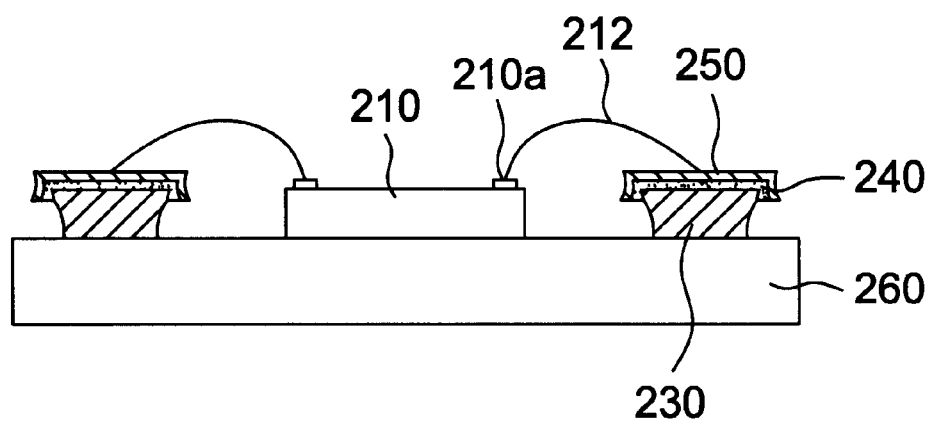

Referring to FIG. 15, the connection pads 230 are formed by etching the concavities of the metal layer 270 without protection of the metal coating (see FIG. 14) such that the connection pads 230 have a substantially concave profile. Then, the semiconductor chip 210 is attached onto sheet carrier 260 through an adhesive layer (not shown) and electrically connected to the connection pads 230 through bonding wires 212.

Finally, the package body 220 is formed over the connection pads 230 and the semiconductor chip 210, a separation process is taken to remove the sheet carrier 260, and then a protective metal flash is plated on the lower surfaces of the connection pads 230 thereby obtaining the low-pin-count chip package 300 as shown in FIG. 11.

According to the present invention, the die pad as well as the connection pads have a substantially concave profile thereby increasing the moisture path and thus prolonging the travel time for moisture penetrating into the functional areas in the package. Further, the concave profile helps the package body to hold the die pad and the connection pads in position thereby enhancing the "locking" of the die pad and the connection pads in the package body.

Although the invention has been explained in relation to its preferred embodiment, it is to be understood that many other possible modifications and variations can be made without departing from the spirit and scope of the invention as hereinafter claimed.

What is claimed is:

1. A low-pin-count chip package, comprising:
  a semiconductor chip having a plurality of bonding pads and provided with an adhesive layer on a lower surface thereof;
  a plurality of connection pads arranged about the periphery of the semiconductor chip and electrically connected to the corresponding bonding pads, wherein each of the connection pads has, a substantially concave profile;
  a metal coating substantially formed on an upper surface of each of the connection pads;
  a package body formed over the semiconductor chip and the connection pads so that the adhesive layer and a lower surface of each of the connection pads are exposed on the bottom of the package body; and
  a protective metal flash formed on the exposed lower surface of each of the connection pads,
    wherein the substantially concave profile helps to lock the connection pads in the package body.

2. The low-pin-count chip package as claimed in claim 1, wherein the protective metal flash comprises a layer of nickel covering the lower surface of the connection pads, and a layer of metal selected from the group consisted of gold and palladium covering the nickel layer.

3. A low-pin-count chip package, comprising:
  a semiconductor chip having a plurality of bonding pads;
  a plurality of connection pads arranged about the periphery of the semiconductor chip and electrically connected to the corresponding bonding pads, wherein each of the connection pads has a substantially concave profile;
  a metal coating formed on an upper surface of each of the connection pads;
  a package body formed over the semiconductor chip and the connection pads so that the adhesive layer and a lower surface of each of the connection pads are exposed on the bottom of the package body; and
  a protective metal flash formed on the exposed lower surface of each of the connection pads;
    wherein the metal coating is also formed on a portion of a side surface of said each of the connection pads adjacent to the upper surface thereof.

4. The low-pin-count chip package as claimed in claim 3, wherein the metal coating comprises a layer of nickel covering the upper surface of the connection pads as well as a portion of the side surface of the connection pads adjacent thereto, and a layer of metal selected from the group consisted of gold and palladium covering the nickel layer.

5. A low-pin-count chip package, comprising:
  a die pad;
  a plurality of connection pads arranged about the periphery of the die pad, wherein each of the die pad and the connection pads has a substantially concave profile;
  a metal coating substantially formed on an upper surface of each of the die pad and the connection pads;
  a semiconductor chip disposed on the die pad and electrically coupled to the connection pads;
  a package body formed over the semiconductor chip and the connection pads so that lower surfaces of the die pad and the connection pads are exposed on the bottom of the package body; and
  a protective metal flash formed on each of the exposed lower surfaces of the die pad and the connection pads, wherein the substantially concave profile helps to lock the die pad and the connection pads in the package body.

6. The low-pin-count chip package as claimed in claim 5, wherein the protective metal flash comprises a layer of nickel covering the lower surfaces of the die pad and the connection pads, and a layer of metal selected from the group consisted of gold and palladium covering the nickel layer.

7. The low-pin-count chip package as claimed in claim 5, wherein the metal coating is also formed on a portion of a side surface of said each of the die pad and the connection pads adjacent to the upper surface thereof.

8. The low-pin-count chip package as claimed in claim 7, wherein the metal coating comprises a layer of nickel covering the upper surface of the die pad and the connection pads as well as a portion of the side surface of the die pad and the connection pads adjacent thereto, and a layer of metal selected from the group consisted of gold and palladium covering the nickel layer.

* * * * *